US005746626A

United States Patent [19]

Kwiat et al.

[11] Patent Number: 5,746,626

[45] Date of Patent: May 5, 1998

[54] ELECTRICAL CONNECTOR ASSEMBLY

[75] Inventors: Karol Kwiat, Thousand Oaks, Calif.; John Sheehan, Bollintemple, Ireland; Ricky Brown, Pomona, Calif.; Pat Doyle, Togher, Ireland

[73] Assignee: Bourns, Inc., Riverside, Calif.

[21] Appl. No.: 728,709

[22] Filed: Oct. 11, 1996

[51] Int. Cl.[6] .................... H01R 23/70

[52] U.S. Cl. .................... 439/630; 439/83; 439/862

[58] Field of Search .................... 439/630, 660, 439/626, 83, 862

[56] References Cited

U.S. PATENT DOCUMENTS

| | | | |
|---|---|---|---|
| 3,697,926 | 10/1972 | Krafthefer | 339/17 L |
| 3,715,706 | 2/1973 | Michel et al. | 339/156 R |
| 4,161,346 | 7/1979 | Cherian et al. | 339/17 M |
| 4,505,529 | 3/1985 | Barkus | 339/17 M |
| 4,511,196 | 4/1985 | Schuler et al. | 339/14 R |
| 4,553,192 | 11/1985 | Babuka et al. | 361/395 |
| 4,738,625 | 4/1988 | Burton et al. | 439/59 |
| 4,983,126 | 1/1991 | Busse et al. | 436/61 |
| 5,035,629 | 7/1991 | Matsuoka | 439/70 |
| 5,069,627 | 12/1991 | Buck et al. | 439/66 |
| 5,092,783 | 3/1992 | Suarez et al. | 439/71 |
| 5,147,207 | 9/1992 | Mowry | 439/66 |
| 5,199,889 | 4/1993 | McDevitt, Jr. | 439/66 |
| 5,220,270 | 6/1993 | Peickert | 320/2 |
| 5,259,769 | 11/1993 | Cruise et al. | 439/65 |
| 5,259,786 | 11/1993 | Huang | 439/500 |
| 5,280,229 | 1/1994 | Faude et al. | 320/2 |
| 5,284,450 | 2/1994 | Fukino et al. | 439/629 |
| 5,338,230 | 8/1994 | Bryce et al. | 439/629 |
| 5,338,231 | 8/1994 | Wilhite | 439/660 |
| 5,354,216 | 10/1994 | Cruise et al. | 439/553 |
| 5,470,255 | 11/1995 | McCleerey et al. | 439/550 |
| 5,494,463 | 2/1996 | Nishio et al. | 439/181 |
| 5,517,434 | 5/1996 | Hanson et al. | 364/708.1 |
| 5,518,424 | 5/1996 | Douty et al. | 439/660 |

*Primary Examiner*—Gary F. Paumen
*Attorney, Agent, or Firm*—Klein & Szekeres, LLP

[57] ABSTRACT

An electrical connector assembly facilitates the establishment of an electrical connection with a terminal on an electrical component when the component and the connector assembly are brought toward each other with the connector assembly in a first orientation relative to the component, and for inhibiting the establishment of an electrical connection with the terminal on the electrical component when the component and the connector assembly are brought toward each other with the connector assembly in a second orientation relative to the component, opposite the first direction. In a preferred embodiment, the connector assembly comprises an insulative housing having a top surface, a bottom surface, a front side, and a rear side; a compartment in the housing defined by a longitudinal opening in the top surface and an opening in the rear side; an aperture in the housing communicating between the front side and the compartment; and a spring contact element disposed in the compartment and comprising a cantilevered portion defined between a front leg and a rear leg. The cantilevered portion extends through the longitudinal opening, the front leg extends through the aperture to form a front terminal lead, and the rear leg extends through the opening in the rear side to form a rear terminal lead. The cantilevered portion is sloped away from the housing as the it extends in the direction from the front side of the housing to the rear side of the housing.

20 Claims, 3 Drawing Sheets

ELECTRICAL CONNECTOR ASSEMBLY

BACKGROUND OF THE INVENTION

This invention relates to electrical connector assemblies. More specifically, it relates to an electrical connector assembly for establishing an electrical connection between an electrical component, especially a battery, and a circuit board, especially a printed circuit board or a printed wiring board.

As the use of printed circuit boards ("PC" boards) has become routine in electronic apparatus, a multitude of devices that provide a removable electrical interconnection between adjacent PC boards, and between a PC board and a separate component, have been devised. Examples of such prior art devices are found in the following U.S. Pat. Nos.:

| | | | |
|---|---|---|---|
| 3,715,706 | Michel et al. | 4,161,346 | Cherian et al. |
| 4,505,529 | Barkus | 4,511,196 | Schuler et al. |
| 4,553,192 | Babuka et al. | 4,738,625 | Burton et al. |
| 4,983,126 | Busse et al. | 5,035,629 | Matsuoka |
| 5,069,627 | Buck et al. | 5,147,207 | Mowry |
| 5,199,889 | McDevitt, Jr. | | |

While many prior art devices have served well in a number of applications, there is still a need for improvement in addressing a number of problems. For example, there is a need to simplify such electrical connecting devices and to reduced their costs of manufacture. Furthermore, there is a need to provide connecting devices that do not necessitate either modification of the PC boards or the addition of other mounting structure, thereby further reducing costs and simplifying the overall manufacturing process of the electronic apparatus. In addition, the connecting devices need to take as little space as possible, thereby allowing overall space savings for the electronic apparatus, and denser packaging of components and PC boards. Moreover, the connecting devices need to provide a reliable, secure electrical connection, and, in many applications, to provide a connection that is able to withstand at least moderate amounts of physical shock and vibration. A further need, in many applications, is for a connector that allows one of the two interconnected PC boards, or the separate component interconnected to a PC board, to be easily removed and reinstalled or replaced. This latter need has been particularly acute in those applications in which a battery is removably connected to a PC board.

One particular type of application for electrical connectors is that of a battery pack installation. In particular, rechargeable battery packs, such as the nickel-cadmium (Ni-Cd) battery packs used in portable electronic apparatus (e.g., cellular telephones, video recorders, two-way radios, etc.) are provided with a plurality of conductive contacts that establish an electrical connection with corresponding contacts in a battery pack receptacle in the apparatus, or in the recharging unit. The receptacle contacts, in turn, consist of the exposed portions of two or more spring contact elements that are part of a connector assembly. The contact elements in the connector assembly are formed with terminations that are connectable to corresponding terminals on a circuit board.

In many such applications, the electrical connection between the battery pack contacts and the receptacle contacts is established by sliding the battery pack into the receptacle in a direction that is substantially parallel to the plane of the circuit board. The receptacle contacts are configured to facilitate the establishment of this sliding connection in a single direction. Since the terminals on the circuit board are fixed, at least two different types of connector assemblies are needed, one to accommodate the sliding connection in each of two opposed directions.

There has thus been a long-felt, but as yet unfulfilled, need for an electrical connector device that satisfactorily addresses all of the aforesaid problems, and that can be installed on a circuit board with equal facility in each of two opposed directions, thereby eliminating the need for two different kinds of connector assemblies.

SUMMARY OF THE INVENTION

Broadly, the present invention is an electrical connector assembly for providing a removable electrical connection between a first electrical component having one or several component contact elements and a second electrical component having one or more terminals, wherein the connector assembly, in accordance with a preferred embodiment of the invention, comprises an insulative housing having a compartment, open at the top and on one side, in which is installed a spring contact element comprising a front leg, a rear leg, and a spring-biased, cantilevered portion therebetween. One side of the housing opposite the open side is provided with an aperture that communicates with the compartment. When the spring contact element is installed in the compartment, its cantilevered portion extends through the top opening, its front leg extends through the aperture and is formed into a first terminal lead, and its rear leg extends out of the open side of the compartment and is formed into a second terminal lead. The first and second terminal leads are configured to suit the desired method of connecting the connector assembly to the second component (e.g., surface-mount, through-hole, etc.).

A specific preferred embodiment is configured for mounting on a circuit board that is installed in a receptacle into which a battery pack or the like is inserted. In such an embodiment, the insulative housing has a plurality of parallel compartments, each of which is open at the top and on the rear side. An aperture through the front side of the housing communicates with each compartment. A spring contact element is installed in each compartment, each contact element comprising a front leg, a rear leg, and a spring-biased, cantilevered portion between the two legs, with the cantilevered portion extending outwardly from the open top of the compartment, so as to be exposed within the receptacle to be accessible for electrical contact with corresponding terminals on the battery pack (or other mating component). When so installed, the front leg of each contact element extends through the aperture in the front side of the housing to form a first terminal lead, and the rear leg extends out of the open rear side of the compartment to form a second terminal lead.

The cantilevered portion is sloped outwardly (away from the housing) from front to rear, thereby facilitating the establishment of electrical contact with the terminals on the battery pack (or other mating component) by a sliding action of the mating component in a direction from the front of the connector assembly to the rear, at an approach angle that is parallel or nearly parallel to the plane of the circuit board on which the connector assembly is mounted. (The plane of the circuit board may be assumed to be substantially parallel to the plane of the bottom surface of the connector assembly housing). The angle of the cantilevered portion at least partially inhibits a rear-to-front motion of the battery pack to establish an electrical connection, thereby providing a mechanism for facilitating a substantially unidirectional, sliding action electrical connection between the battery pack terminals and the spring contact elements of the connector assembly.

The contact element, although preferably of unitary, one-piece structure, may comprise a separate front leg, rear leg, and cantilevered portion that are mechanically and electrically connected to each other.

The present invention thus provides a connector assembly with two parallel sets of terminal leads: a first set of terminal leads along the front edge, and a second set along the rear edge. Thus, for a circuit board with corresponding sets of terminals, the connector assembly of the present invention can be soldered to the circuit board terminals in a first orientation to allow the above-described unidirectional, sliding action electrical connection in a first direction. The connector assembly can simply be turned 180 degrees around an axis that is perpendicular to the circuit board and then soldered to the same set of board terminals if it is desired to facilitate the sliding action electrical connection in a second direction 180 degrees opposed to the first direction.

Thus, given a circuit board with a fixed set of terminals, the same connector assembly can be used for a unidirectional, sliding action connection in either of two opposite directions, depending upon the orientation in which the connector assembly is connected to the terminals on the board. In this manner, rather than have two different types of connector assemblies in inventory, one for each direction relative to the board in which the connection is to be made, only one type of connector assembly is needed that can be converted from one direction to the other merely by switching its orientation relative to the board, while using the same terminals on the board in both orientations.

Furthermore, as will be more fully appreciated from the detailed description that follows, the present invention provides a connector assembly that is simple and economical to manufacture, does not require any modification of an existing circuit board, and does not require additional mounting hardware. Moreover, the connector assembly of the present invention provides a reliable, secure electrical connection that is able to withstand at least moderate amounts of physical shock and vibration, and that is sufficiently durable to withstand repeated installation and removal of the battery pack (or other mating component) over a prolonged period of time.

These and other advantages of the present invention will be explained more fully in the detailed description that follows.

DETAILED DESCRIPTION OF THE PREFERRED EMBODIMENT

Figure 1:
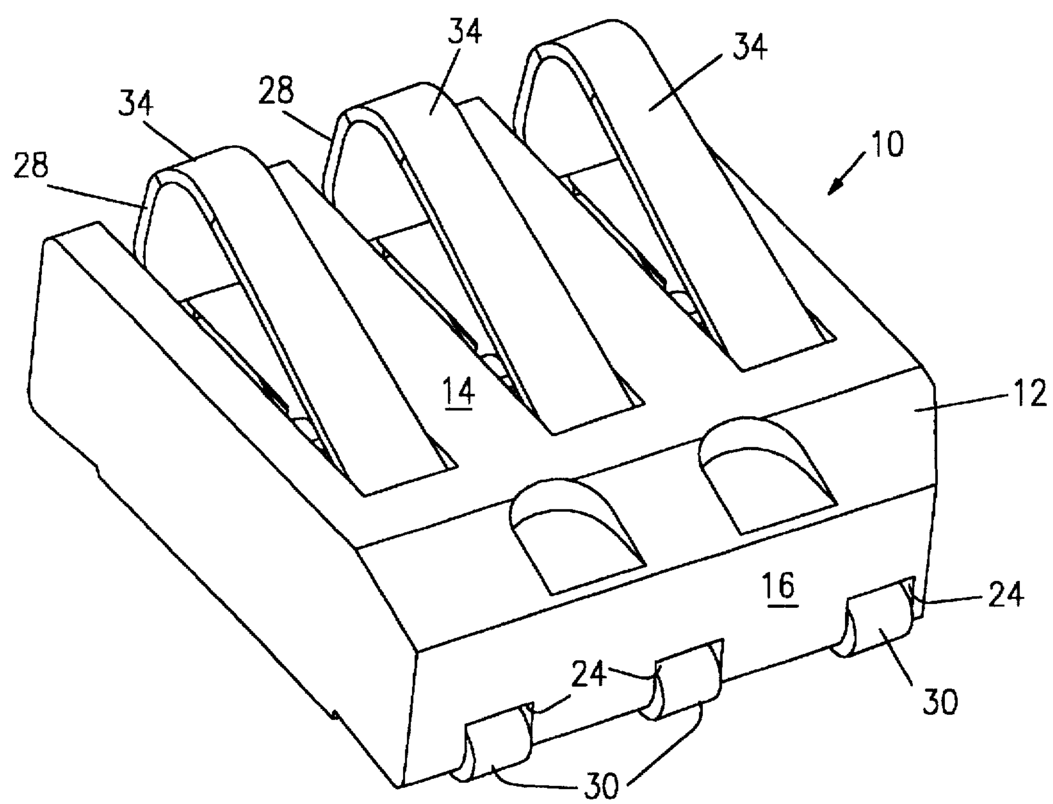
FIG. 1 is a front perspective view of an electrical connector assembly in accordance with a preferred embodiment of the present invention.
Figure 5:
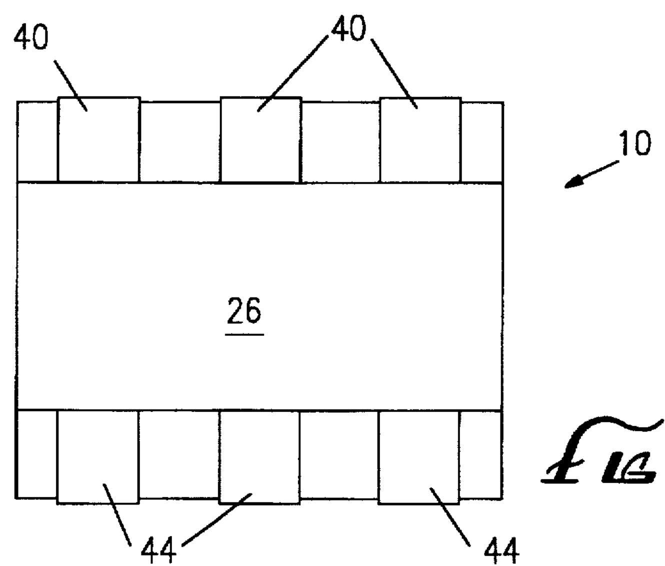
FIG. 5 is a bottom plan view of the connector assembly of FIG. 1.
Figure 2:
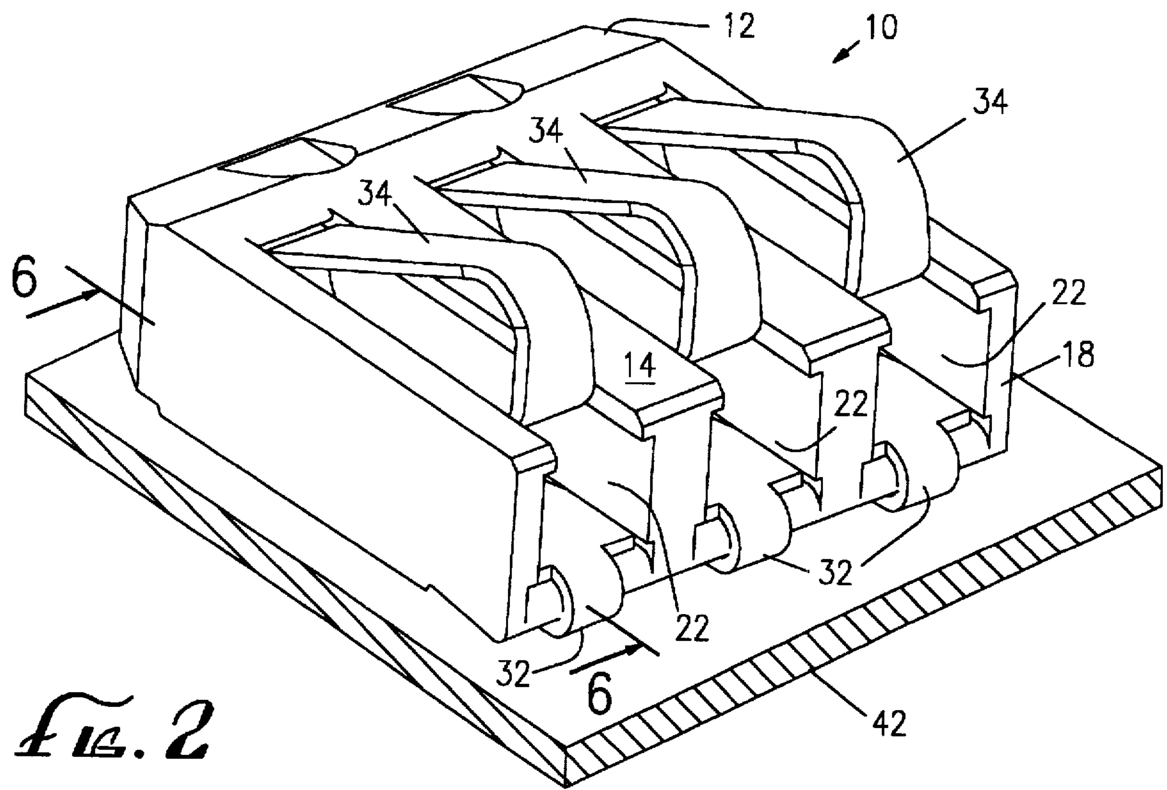
FIG. 2 is a rear perspective view of the electrical connector assembly of FIG. 1, showing the connector assembly mounted on a circuit board.

Referring now to the drawings, an electrical connector assembly 10, in accordance with a preferred embodiment of the present invention, includes an insulative housing 12 having a top surface 14, a front side 16 (best shown in FIG. 1), a rear side 18 (best shown in FIG. 2), and a bottom surface 20 (best shown in FIG. 5). The housing 12 is formed (i.e., of molded plastic) with a plurality of parallel, longitudinal channels or compartments 22, each of which is open through the top surface 14 and the rear side 18. An aperture 24 through the front side 16 of the housing 12 communicates with each compartment 22 through a front wall interior surface 26 that defines the front end of each compartment 22.

Figure 6:
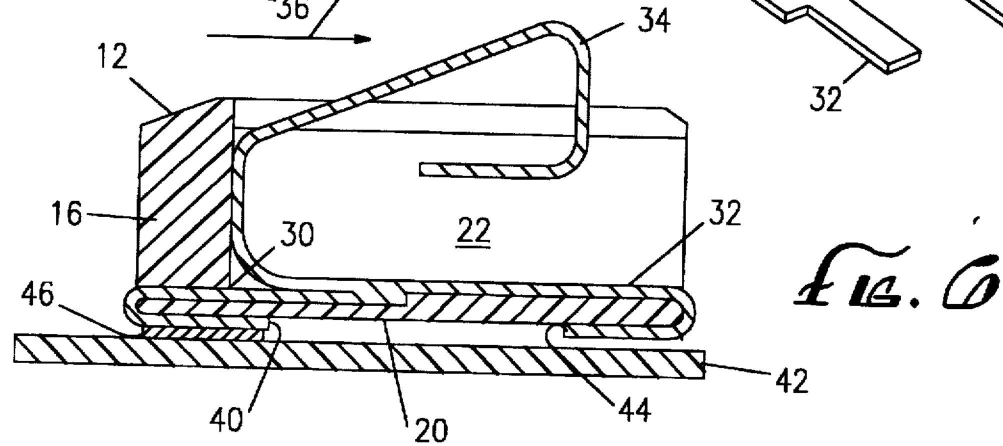
FIG. 6 is a cross-sectional view taken along line 6—6 of FIG. 2, and showing the establishment of electrical contact between the connector assembly and a mating electrical component.
Figure 7:
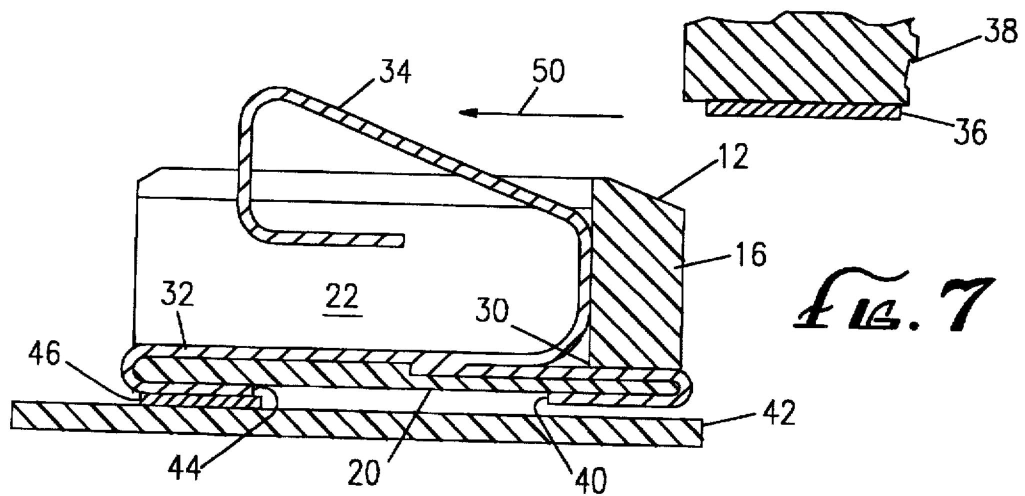
FIG. 7 is a cross-sectional view similar to that of FIG. 6, but showing the connector assembly rotated 180 degrees around an axis that is perpendicular to the plane of the circuit board.

A spring contact element 28 is installed in each of the compartments 22, each contact element 28 comprising a front leg 30, a rear leg 32, and a spring-biased, cantilevered portion 34 between the front leg 30 and the rear leg 32. The cantilevered portion 34 extends outwardly from the open top of the compartment 22, so as to be exposed for electrical contact with corresponding terminals 36 (only one of which is shown in FIGS. 6 and 7) on a mating electrical component 38 (which may be, for example, a battery pack). When so installed, the front leg 30 of each contact element 28 extends through the aperture 24 in the front side 16 of the housing 12, and then down and under the bottom surface 20 of the housing 12 to form a first or front surface mount terminal lead 40 for mounting the connector assembly 10 on a circuit board 42 (FIGS. 2, 6, and 7), as described below. The rear leg 32 of the contact element 28 extends out of the compartment 22 through the open rear side 18 of the housing 12, and then, likewise, extends down and under the bottom surface 20 of the housing 12 to form a second or rear surface mount terminal lead 44.

Although the connector assembly described above and shown in the drawings has terminal leads 40, 44 configured for surface-mount installation, it will be appreciated that they can readily be configured for other types of installations, such as through-hole installations, as is well known in the art.

Figure 3:
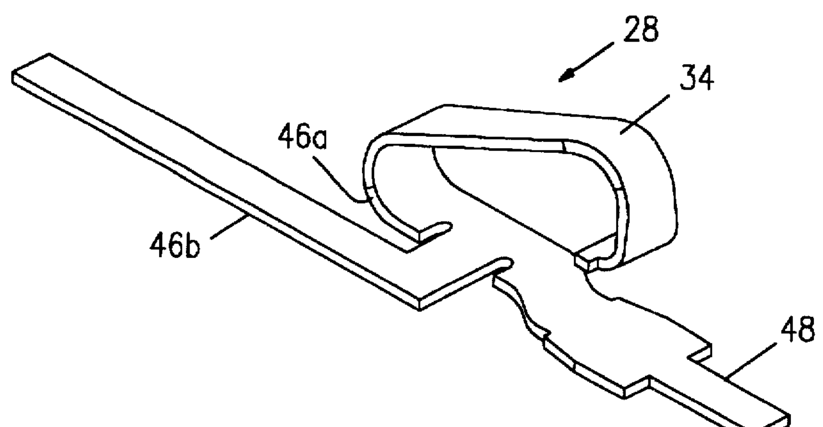
FIG. 3 is a perspective view of a spring contact element, of the type used in the present invention, as it would be configured prior to installation in the connector assembly.
Figure 4:
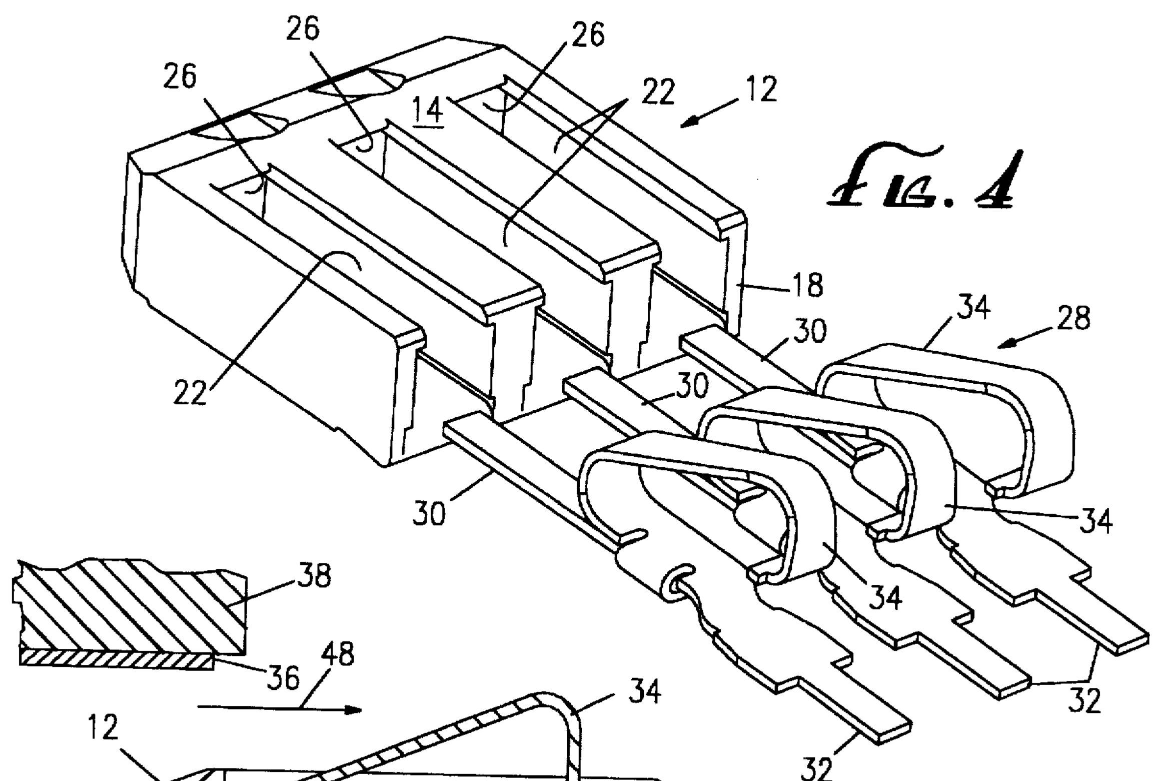
FIG. 4 is a rear perspective view showing the step of installing a set of spring contact elements into a housing during the process of manufacturing the electrical connector assembly of FIG. 1.

The contact element 28, although preferably a unitary, one-piece structure, may comprise a separate front leg 30, rear leg 32, and cantilevered portion 34 that are mechanically connected, bonded, or soldered to each other. When formed as a unitary structure, as shown in FIG. 3, the contact elements 28 may be initially formed from a stamped lead frame (not shown), wherein each contact element 28 starts out as a flat piece of conductive metal, having first and second relatively long, parallel, linear prongs *46a*, *46b*, respectively, extending in one direction, and a relatively short prong 48, extending in the opposite direction, which forms the rear leg 32 of the contact element 28. In FIG. 3, the first long prong *46a* is shown after it has been bent back over itself toward the short prong 48 to form the cantilevered portion 34. The second long prong *46b* is bent, folded, or twisted 180 degrees around its longitudinal axis so that it underlies the cantilevered portion 34 and is colinear with the short prong 48, as best shown in FIG. 4, thereby forming the front leg 30 of the contact element 28. The contact elements 28 are then installed in the compartments 22, as described above, through the openings in the rear housing wall 18, either while still attached to the lead frame (not shown), or after they have been separated from it. Finally, the front leg 30 and the rear leg 32 of each contact element 28 are bent to form the front terminal lead 40 and the rear terminal lead 44, respectively, as described above.

The cantilevered portion 34 of each contact element 28 is sloped outwardly (away from the housing 12) from front to rear, thereby facilitating the establishment of electrical contact with the terminals 36 on the mating component 38 by a sliding action of the mating component from the front of the connector assembly 10 to the rear, at an approach angle that is parallel or nearly parallel to the plane of the circuit board 42. (The plane of the circuit board 42 may be assumed to be substantially parallel to the plane of the bottom surface 20 of the housing 12). The angle of the cantilevered portion 34 at least partially inhibits a rear-to-front sliding motion of the mating component 38 to establish an electrical connection, thereby providing a mechanism to facilitating a substantially unidirectional, sliding action electrical connection between the mating component terminals 36 and the spring contact elements 28 of the connector assembly 10.

As best shown in FIG. 5, the connector assembly 10 thus provides two parallel sets of terminal leads on the bottom surface 20 of the housing 12: a first set of front terminal leads 40 along the front edge, and a second set of rear terminal leads 44 along the rear edge. The advantages of this arrangement are shown in FIGS. 6 and 7, in which the same connector assembly 10 is shown mounted on the circuit board 42 in two different orientations.

For each of the contact elements 28, the center lines of the front terminal lead 40 the rear terminal lead 44, and the cantilevered portion 34 are substantially colinear with each other, and lie in a plane that passes through the longitudinal axis of the cantilevered portion 34 and that is perpendicular to the bottom surface 20 of the housing 12.

In FIG. 6, the connector assembly 10 is shown as mounted on the circuit board 42 in a first orientation, wherein the circuit board has a first set of terminals 46 (only one of which is shown), and a second set of terminals 47 (only one of which is shown). The connector assembly 10 is attached (as by a solder joint, not shown) to the first set of terminals 46 via the first (front) set of terminal leads 40 and to the second set of terminals 47 via the second (rear) set of terminal leads 44. This orientation of the connector assembly 10 facilitates the above-described unidirectional, sliding action electrical connection in a first direction, as indicated by an arrow designated by the numeral 48.

As shown in FIG. 7, the connector assembly 10 can simply be turned 180 degrees around an axis that is perpendicular to the circuit board 42 and then connected to the first set of board terminals 46 via the second (rear) set of terminal leads 44, and to the second set of board terminals 47 via the first (front) set of terminal leads 40, if it is desired to facilitate the sliding action electrical connection from a second direction 180 degrees opposed to the first direction, as indicated by an arrow designated by the numeral 50.

Thus, given a circuit board 42 with fixed sets of terminals 46 and 47, the same connector assembly 10 can be used for a unidirectional, sliding action connection in either of two opposite directions, depending upon which of the two above-described orientations is used for connecting the connector assembly 10 to the terminals 46 and 47 on the board 42. In this manner, rather than having two different types of connector assemblies in inventory, one for each direction relative to the board in which the connection is to be made, only one type of connector assembly 10 is needed that can be converted from one direction to the other merely by switching its orientation relative to the board 42, while using the same terminals 46, 47 on the board 42 in both orientations.

The above-described invention has further advantages resulting from the stability afforded by the connection of the connector assembly to the board by means of two parallel sets of terminal leads. For example, the inherent stability of this configuration, and the self-aligning capability due to the symmetry of the terminal lead arrangement, obviate the need for locating pins on the connector assembly and the corresponding pin-receiving holes in the board. This frees up space on both sides of the board for conductive traces, wires, and/or other components, thereby resulting in more efficient space utilization. Furthermore, the use of two sets of terminal leads results in enhanced adhesion to the circuit board, with the adhesion forces being substantially equal in the front and rear of the contact assembly. This enhances the reliability and security of the electrical connection, and provides a structure that is capable of withstanding at least moderate amounts of physical shock and vibration.

While a preferred embodiment has been shown and described, a number of variations and modifications may suggest themselves to those skilled in the pertinent arts. For example, as mentioned above, the contact elements 28 may be fabricated in a variety of configurations, either as integral units, as described above, or as comprising separate front legs 30, rear legs 32, and cantilevered portions 34 that are mechanically connected, bonded, or soldered to each other. It will also be appreciated that the terminations of the contact elements 28 can be configured for through-hole board mounting as well as surface mounting. Furthermore, the connector assembly 10 can be made with any desired number of contact elements 28, the illustrated embodiment having three contact elements being exemplary only. Moreover, the precise configuration of the housing 12 is somewhat arbitrary, in that any housing shape that is suitable for a particular application may be employed. Indeed, the housing 12 may be made of two or more parts, mechanically connected or bonded together. Furthermore, the rear side 18 of the housing 12 may be apertured (as is the front side 16), instead of open, for accommodating the rear contact element legs 32. Alternatively, the front and rear housing sides may be substantially solid walls, with the front and rear contact element legs extending through the front and rear walls, respectively, or through the bottom housing surface proximate the front and rear walls, respectively. These alternative configurations will require assembly methods that are different from that described above. These and other modifications and variations that may suggest themselves should be considered within the spirit and scope of the present invention, as defined in the claims that follow.

What is claimed is:

1. An electrical connector assembly, comprising:

an insulative housing having a top surface, a bottom surface, a front side, and a rear side;

a compartment in the housing defined by a longitudinal opening in the top surface and an opening in the rear side;

an aperture in the housing communicating between the front side and the compartment; and a spring contact element disposed in the compartment and comprising a cantilevered portion defined between a front leg and a rear leg;

wherein the cantilevered portion extends through the longitudinal opening, the front leg extends through the aperture to form a front terminal lead, and the rear leg extends through the opening in the rear side to form a rear terminal lead.

2. The connector assembly of claim 1, wherein the front and rear terminal leads are directed toward each other under the bottom surface of the housing to form front and rear surface mount terminal leads, respectively.

3. The connector assembly of claim 1, wherein the contact element comprises a unitary, one-piece structure.

4. The connector assembly of claim 1, wherein the cantilevered portion is configured to facilitate the establishment of an electrical connection with a terminal on an electrical component by means of a substantially unidirectional sliding motion of the component in a first direction from the front side of the housing to the rear side of the housing, while inhibiting the establishment of an electrical connection by the motion of the component in a second direction opposite to the first direction.

5. The connector assembly of claim 4, wherein the cantilevered portion is sloped away from the housing as the cantilevered portion extends in the direction from the front side of the housing to the rear side of the housing.

6. A method of manufacturing an electrical connector assembly, comprising the steps of:

(a) providing an insulative housing having a top surface, a bottom surface, a front side, a rear side, a compartment defined by a longitudinal opening in the top surface and an opening through the rear side, and an aperture through the front side communicating with the compartment;

(b) providing a spring contact element comprising a cantilevered portion defined between a front leg and a rear leg;

(c) installing the spring contact element in the compartment so that the cantilevered portion extends upwardly through the longitudinal opening, the front leg extends forwardly through the front side of the housing, and the rear leg extends rearwardly through the rear side of the housing; and (d) forming the front and rear legs into front and rear terminal leads, respectively.

7. The method of claim 6, wherein the forming step comprises the step of directing the front and rear legs toward each other under the bottom surface of the housing to form front and rear surface mount terminal leads, respectively.

8. The method of claim 6, wherein the step of providing the spring contact element comprises the steps of:

(b)(1) providing a flat piece of conductive metal having first and second substantially parallel prongs extending in a first direction, and a third prong extending in a second direction opposite to the first direction;

(b)(2) directing one of the first and second prongs back over itself toward the third prong to form a cantilevered portion; and (b)(3) turning the other of the first and second prongs 180 degrees around its longitudinal axis so that it substantially underlies the cantilevered portion, thereby forming the front leg; whereby the third prong forms the rear leg.

9. An electrical connector assembly for establishing an electrical connection with a terminal on an electrical component when the component and the connector assembly are brought toward each other with the connector assembly in a first orientation relative to the component, and for inhibiting the establishment of an electrical connection with the terminal on the electrical component when the component and the connector assembly are brought toward each other with the connector assembly in a second orientation relative to the component, opposite the first direction, the connector assembly comprising:

an insulative housing having a top surface, a bottom surface, a front side, and a rear side;

a compartment in the housing defined by a longitudinal opening in the top surface and an opening in the rear side;

an aperture in the housing communicating between the front side and the compartment; and a spring contact element disposed in the compartment and comprising a cantilevered portion defined between a front leg and a rear leg;

wherein the cantilevered portion extends through the longitudinal opening, the front leg extends through the aperture to form a front terminal lead, and the rear leg extends through the opening in the rear side to form a rear terminal lead, and wherein the cantilevered portion is sloped away from the housing as the cantilevered portion extends in the direction from the front side of the housing to the rear side of the housing.

10. The connector assembly of claim 9, wherein the front and rear terminal leads are directed toward each other under the bottom surface of the housing to form front and rear surface mount terminal leads, respectively.

11. The connector assembly of claim 9, wherein the contact element comprises a unitary, one-piece structure.

12. The connector assembly of claim 9, wherein the cantilevered portion is configured to facilitate the establishment of an electrical connection with a terminal on an electrical component by means of a substantially unidirectional sliding motion of the component in a first direction from the front side of the housing to the rear side of the housing, while inhibiting the establishment of an electrical connection by the motion of the component in a second direction opposite to the first direction.

13. The connector assembly of claim 12, wherein the cantilevered portion is sloped away from the housing as the cantilevered portion extends in the direction from the front side of the housing to the rear side of the housing.

14. An electrical connector assembly for establishing an electrical connection with a terminal on an electrical component when the component and the connector assembly are brought toward each other with the connector assembly in a first orientation relative to the component, and for inhibiting the establishment of an electrical connection with the terminal on the electrical component when the component and the connector assembly are brought toward each other with the connector assembly in a second orientation relative to the component, opposite the first direction, the connector assembly comprising:

an insulative housing having a top surface with a longitudinal opening therein, a bottom surface, a front side, and a rear side; and a spring contact element installed in the housing and comprising a cantilevered portion defined between a front leg and a rear leg;

wherein the cantilevered portion extends through the longitudinal opening, the front leg extends through the front side of the housing to form a front terminal lead, and the rear leg extends through the rear side of the housing to form a rear terminal lead, and wherein the cantilevered portion is sloped away from the housing as the cantilevered portion extends in the direction from the front side of the housing to the rear side of the housing.

15. The connector assembly of claim 14, wherein the front and rear terminal leads are directed toward each other under the bottom surface of the housing to form front and rear surface mount terminal leads, respectively.

16. The connector assembly of claim 14, wherein the contact element comprises a unitary, one-piece structure.

17. The connector assembly of claim 14, wherein the cantilevered portion is configured to facilitate the establishment of an electrical connection with a terminal on an electrical component by means of a substantially unidirectional sliding motion of the component in a first direction from the front side of the housing to the rear side of the housing, while inhibiting the establishment of an electrical connection by the motion of the component in a second direction opposite to the first direction.

18. The connector assembly of claim 17, wherein the cantilevered portion is configured to facilitate the establishment of the electrical connection by means of a sliding motion of the component in the first direction at an approach angle that is approximately parallel to the plane of the bottom surface of the housing.

19. The connector assembly of claim 17, wherein the cantilevered portion is sloped away from the housing as the cantilevered portion extends in the direction from the front side of the housing to the rear side of the housing.

20. The connector assembly of claim 14, wherein the center lines of the front terminal lead, the rear terminal lead, and the cantilevered portion are substantially colinear with each other, and lie in a plane that passes through the longitudinal axis of the cantilevered portion and that is perpendicular to the bottom surface of the housing.

* * * * *